(12) United States Patent
Iinuma

(10) Patent No.: US 7,022,584 B2
(45) Date of Patent: Apr. 4, 2006

(54) METHOD OF MANUFACTURING A SHALLOW TRENCH ISOLATION STRUCTURE

(75) Inventor: Taikan Iinuma, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 107 days.

(21) Appl. No.: 10/760,458

(22) Filed: Jan. 21, 2004

(65) Prior Publication Data
US 2005/0070089 A1    Mar. 31, 2005

(30) Foreign Application Priority Data
Sep. 29, 2003    (JP)    ............... 2003-337624

(51) Int. Cl.
*H01L 21/76*    (2006.01)

(52) U.S. Cl. ...................... 438/437; 438/435

(58) Field of Classification Search ........... 438/424, 438/435, 437
See application file for complete search history.

(56) References Cited

U.S. PATENT DOCUMENTS

| | | | |
|---|---|---|---|
| 6,465,866 B1 * | 10/2002 | Park et al. | 257/510 |
| 6,548,866 B1 * | 4/2003 | Noguchi | 257/345 |
| 6,566,224 B1 * | 5/2003 | Chang et al. | 438/424 |
| 2002/0117731 A1 * | 8/2002 | Kim et al. | 257/510 |

FOREIGN PATENT DOCUMENTS

JP    2001210709    8/2001

* cited by examiner

*Primary Examiner*—Christian D. Wilson
(74) *Attorney, Agent, or Firm*—Volentine Francos & Whitt, PLLC

(57) ABSTRACT

A semiconductor device is improved in reliability by suppressing the electric-field concentration at a top edge of a trench or the leak current at a bottom edge thereof. A first thermal oxide film is formed by carrying out low-temperature wet oxidation at a silicon substrate heating temperature of approximately 950° C., extending from over a bottom surface of the trench formed in a main surface of a silicon substrate to an intermediate point on a sidewall of the trench. Thereafter, a second thermal oxide film is formed by carrying out high-temperature dry oxidation at a silicon substrate heating temperature of approximately 1100° C., extending from the intermediate point to over the main surface of the silicon substrate outside the trench.

15 Claims, 4 Drawing Sheets

METHOD OF MANUFACTURING A SHALLOW TRENCH ISOLATION STRUCTURE

BACKGROUND OF THE INVENTION

1. Technical Field of the Invention

This invention relates to a method for manufacturing a semiconductor device and, more particularly, to a method for manufacturing a semiconductor device having a device isolation part.

2. Description of the Related Art

There is an STI (Shallow Trench Isolation) method utilizing a trench structure, as a device isolation art to isolate between the elements on a semiconductor device.

The STI method refers to a scheme of burying an insulation film in a trench formed in a semiconductor substrate and forming a device isolation part thereby providing isolation between elements.

With the STI method, the width of isolation can be reduced as compared to that of the LOCOS (Local Oxidation Of Silicon) scheme utilizing the existing thermal oxidation.

For this reason, attentions are drawn to the STI technique as a micro-fabrication technology for device isolation part due to the recent miniaturization of semiconductor devices (e.g. Patent Document: JP-A-2001-210709).

In the STI scheme, prior to burying a device-isolation insulator within a trench formed in a semiconductor substrate, a thermal oxidation film is formed in an inner surface, as a bottom and sidewall, of the trench. This is because to remove the device damage by defects or the like caused in the trench inner wall by the etching for forming the trench.

However, there are the following problems so far encountered upon forming a thermal oxide film.

Where a thermal oxide film is formed by wet oxidation with heating a substrate at nearly 950° C., the thermal oxide film at a top edge of the trench is reduced in thickness into an acute-angled form (or sharp-edged form). This is because a film stress occurs in the trench top edge when the semiconductor substrate material expands in volume into an oxide film, resulting in lowered oxidation rate at the edge.

As a result, electric-field concentration takes place at the trench top edge, due to which the electric characteristics of transistors are deteriorated by the lowered reliability of the gate oxide film.

Meanwhile, when a thermal oxide film is formed by the dry oxidation with substrate heating at nearly 1100° C., the foregoing problem of reduced thermal oxide film thickness can be overcome. However, (111) crystal plane (facet) occurs mainly at a bottom edge of trench.

Because stresses concentrate at the trench bottom edge due to facet occurrence, crystal defects such as cracks are caused. As a result, the junction leak current of a transistor is ready to occur, which causes deterioration in the transistor electric characteristic.

SUMMARY OF THE INVENTION

Therefore, it is a principal object of the present invention to provide a method for manufacturing a semiconductor device overcoming the foregoing various problems of thermal oxide films and having higher reliability than the conventional.

In order to achieve the object, a method for manufacturing a semiconductor device of the present invention possesses the following feature.

Namely, a method for manufacturing a semiconductor device of the invention includes a step of forming a groove, a step of forming a first thermal oxide film and a step of forming a second thermal oxide film.

In the groove forming step, a groove for forming a device isolation part is formed on a main surface of a semiconductor substrate. In the first thermal oxide film forming step, a first thermal oxide film is formed by wet oxidation, extending from over a bottom surface of the groove to a point on a sidewall of the groove lower by a predetermined amount than a top height of the sidewall. In the second thermal oxide film forming step, a second thermal oxide film is formed by dry oxidation, extending from a height of the relevant point on the sidewall of the groove or the higher to over the main surface of the substrate.

According to the method of the present invention, it is possible to form a first thermal oxide film at a bottom edge of a groove, i.e. a trench, by wet oxidation and a second thermal oxide film at a top edge of the trench by dry oxidation.

As a result, it is possible to overcome the facet occurring in a thermal oxide film at the trench bottom edge and the thickness reduction in the thermal oxide film at the trench top edge, at the same time.

Namely, by individually forming a thermal oxide film at each edge under the thermal oxidation condition suited for the edge, it is possible to obtain a semiconductor device higher in reliability than the conventional, which overcomes the foregoing various problems of the conventional thermal oxide film.

DETAILED DESCRIPTION OF THE INVENTION

An embodiment of the present invention will now be explained with reference to FIGS. 1A to 4B. It is noted that the figures are mere schematic showings of shapes, sizes and positional relationship of the constituent elements in an extent as understanding the invention, and hence the invention is not limited to the illustrated examples. Furthermore, the hatching designating a section is omitted except for certain parts, in order for easily understanding the figure. The ensuing explanation is on a mere preferred embodiment, and the invention is not limited to the numerical conditions exemplified. Meanwhile, the like components or elements are attached with the same numerals in order to omit duplicated explanations.

Explanation is now made on a manufacturing method for a semiconductor device of the present invention.

At first, a groove for forming an isolation part, or trench, is formed in the following procedure.

Figure 1A:
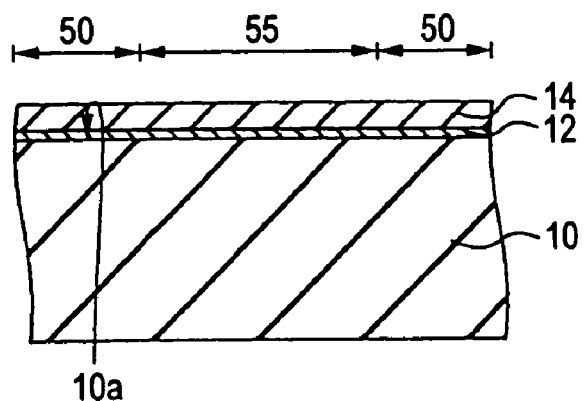
FIGS. 1A to 1D are schematic sectional views (1) for explaining a manufacturing process for a semiconductor device according to the present invention.

Prepared is a silicon (Si) substrate 10 as a semiconductor substrate. The silicon substrate 10 is designated with a plurality of regions for devices (also called active regions) 50 and an isolation region (also called field region) 55 for isolating and separating the device regions one from another. On the main surface 10a of the silicon substrate 10, a pad oxide film 12 and a silicon nitride film (SiN) 14 are formed in the order (FIG. 1A). The pad oxide film 12 serves to prevent impurities from intruding into the device region 50 of the silicon substrate 10 and to relax the stress caused between the silicon nitride film 14 and the silicon substrate 10. The pad oxide film 12 herein is formed by a silicon oxide film ($SiO_2$) having a film thickness of 1.5 nm, through the wet oxidation with heating up the substrate to approximately 850° C. Meanwhile, a silicon nitride film 14 is formed to a film thickness of 150 nm by the use of an LP-CVD (low Pressure-Chemical Vapor Deposition) process based on a dichlorosilane ($SiH_2Cl_2$) gas (as the main ingredient).

Wet oxidation refers to a thermal oxidation scheme of heating up a semiconductor substrate surface in an atmosphere containing water vapor and oxygen and thereby forming a thermal oxidation film on the semiconductor substrate surface. The wet oxidation herein can use usual pyrogenic oxidation (also called hydrogen gas combustive oxidation), for example. Pyrogenic oxidation is a method of burning hydrogen ($H_2$) and oxygen ($O_2$) gases at an elevated temperature to thereby produce water vapor for utilization in thermal oxidation. Incidentally, it is assumed that pyrogenic oxidation, steam oxidation or the like is suitably selected and carried out also in the other wet oxidation of this embodiment.

Figure 1B:
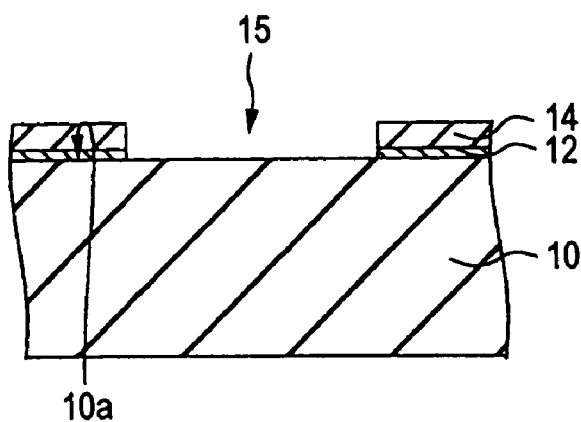

Next, after a resist film is formed on the silicon nitride film 14 (not shown), photolithography etching is carried out on the pad oxide film 12 and silicon nitride film 14, to patterning-form an opening 15 exposing the main surface 10a of silicon substrate at a region for trench forming (FIG. 1B).

Figure 1C:
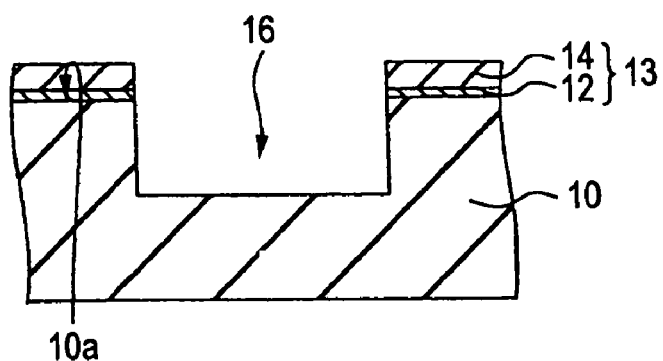

Next, the pad oxide film 12 and silicon nitride film 14 formed with the opening 15 is used as a trench-forming mask 13, to carry out first etching on the silicon substrate 10. Thus, a trench 16 is formed in the main surface 10a of the silicon substrate (FIG. 1C).

Figure 1D:
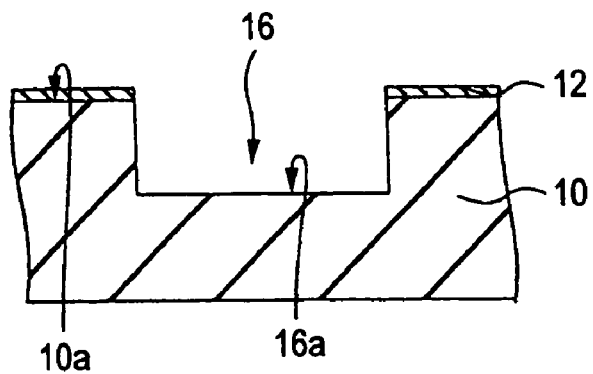

Herein, in the first etching, RIE (reactive ion etching) is carried out by the use of a gas based on chloride ($Cl_2$) (as the main ingredient), to form the silicon substrate with a trench 16 as a recess having a depth of approximately 200–400 nm with respect to the main surface thereof. The trench 16 has a bottom surface 16a formed at an intermediate depth in a thicknesswise direction of the silicon substrate 10, preferably parallel with the main surface 10a of the silicon substrate. Thereafter, the silicon nitride film 14 is removed by wet etching using a hot phosphoric acid ($H_3PO_4$) (FIG. 1D).

Subsequently, a first thermal oxide film is formed in the following procedure.

Figure 2A:
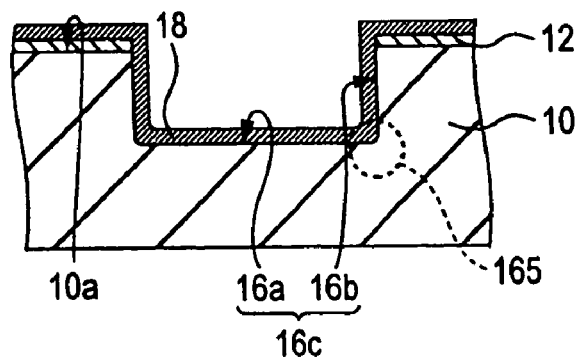
FIGS. 2A to 2D are schematic sectional views (2) for explaining a manufacturing process for a semiconductor device according to the invention.

At first, a silicon oxide film 18 as a pre-first thermal oxide film is formed by low-temperature wet oxidation, extending from the bottom surface 16a of the trench 16 to a region on the main surface 10a of the silicon substrate 10 outside the trench 16 (FIG. 2A). Low-temperature wet oxidation, generally, refers to wet oxidation to be made at a substrate heating temperature Tw in a range of from 700 to 1000° C. In this embodiment, the substrate heating temperature Tw is preferably in a range of from 800 to 950° C.

Herein, by means of low-temperature wet oxidation with heating a trench-formed silicon substrate 10 to approximately 950° C., the pre-first thermal oxide film 18 is formed in a thickness of 20 to 40 nm covering the inner surface 16c of the trench 16 and the pad oxide film 12.

By thus forming the pre-first oxide film 18 based on low-temperature wet oxidation, almost no facet is caused in a trench bottom edge 165. Note that the trench bottom edge 165 herein refers to a region of a ridge formed by the trench bottom surface 16a and the sidewall 16b, including the vicinity thereof, i.e. corner regions.

Figure 2B:
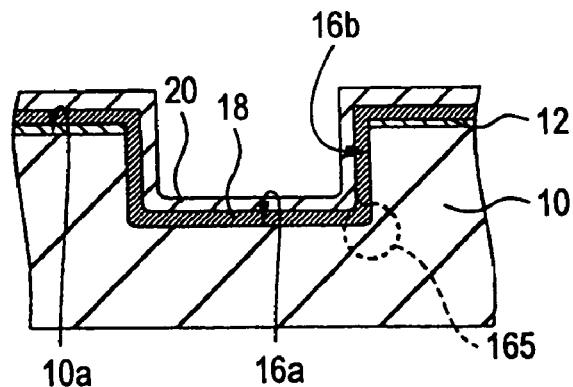

Thereafter, a silicon nitride film 20, which is to serve as an etching-resisting film in the later process, is formed in a film thickness range of from 20 to 40 nm on the pre-first thermal oxide film 18 by using an LP-CVD process based on a dichlorosilane gas (as the main ingredient) (FIG. 2B).

Figure 2C:
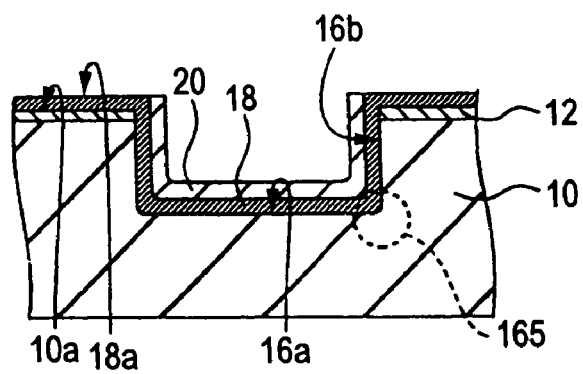

Thereafter, removed is a part of the silicon nitride film 20 formed on the main surface 10a outside the trench 16 of the silicon substrate 10. This removal of silicon nitride film is by the polishing using a CMP (chemical mechanical polish) scheme in a manner to expose the surface of the pre-first thermal oxide film 18 (FIG. 2C).

In this polish, the silicon nitride film 20 can be removed which is to be obstructive, in the later process, in carrying out second etching to expose the region extending from the main surface 10a to a predetermined position P (hereinafter explained) on the sidewall 16b, of the surface of the silicon substrate 10.

Figure 2D:
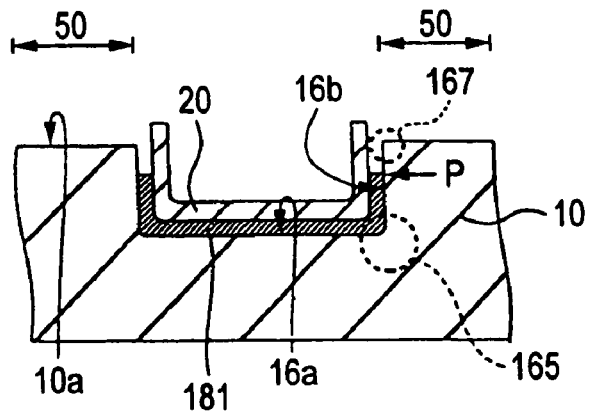

Thereafter, second etching is carried out on the silicon oxide film by using the remaining silicon nitride film 20 as a etching-resisting mask, i.e. a mask. By the second etching, exposed is the part extending from the main surface 10a to a intermediate position P in the sidewall 16b of the surface of the silicon substrate 10 (FIG. 2D). The intermediate point P is assumably taken a position at a height a predetermined amount lower than the top end of the trench sidewall.

Herein, wet etching is carried out as second etching with an etching solution having a greater etch rate on the silicon oxide film than that on the silicon nitride film 20 and silicon substrate 10, thereby selectively removing the silicon oxide film. The etching solution can use a liquid containing a hydrogen fluoride (HF) solution (hydrogen fluoride acid), for example.

In this manner, removed are the pad oxide film 12 and pre-first thermal oxide film 18 in the active region 50 on the silicon substrate as well as the pre-first thermal oxide film formed in the higher position than the intermediate point P on the trench sidewall 16b.

Herein, the pre-first thermal oxide film 18 on the trench sidewall 16b is vertically excavated at the surface 18a (see FIG. 2C) of the post-CMP pre-first thermal oxide film down to a depth in a range of 100 to 200 nm with respect to the main surface 10a, thereby exposing a top edge 167 of the trench. Note that the trench top edge 167 herein refers to the region of a ridge formed by the trench sidewall 16b and the substrate main surface 10a, including the vicinity thereof, i.e. corner regions.

In this manner, a first thermal oxide film 181 can be formed by the remaining part of the pre-first thermal oxide film, which exposes the trench top edge 167 while covering over the trench bottom surface 16a and trench bottom edge 165.

Subsequently, a second thermal oxide film is formed in the following procedure.

Figure 3A:
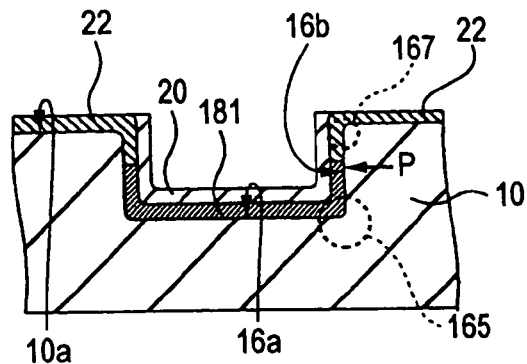
FIGS. 3A to 3D are schematic sectional views (3) for explaining a manufacturing process for a semiconductor device according to the invention.

At first, a silicon oxide film 22 as a second thermal oxide film is formed by high-temperature dry oxidation, extending from the intermediate point P on the trench sidewall 16b to over the substrate main surface 10a, that is, the part which is exposed by the second etching (FIG. 3A).

Dry etching refers to a method of heating up the semiconductor substrate surface in a dry oxygen atmosphere and causing thermal oxidation in the semiconductor substrate surface. Meanwhile, high-temperature dry oxidation refers generally to the dry oxidation to be carried out at a substrate heating temperature Td (° C.) in a range of from 800 to 1200° C. Herein, the substrate heating temperature Td is preferably 1000° C. or higher.

Accordingly, high-temperature dry etching is carried out at a substrate heating temperature of approximately 1100° C., to form the second thermal oxide film 22 in a thickness of from 20 to 40 nm extending from the point P on the trench sidewall 16b to over the substrate main surface 10a. At this time, the etching-resisting film 20 remaining on the first thermal oxide film 181 serves as an antioxidation film that prevents the second thermal oxide film 22 from being formed on the first thermal oxide film 181. Accordingly, after forming the second thermal oxide film, almost no facet is caused in the bottom edge 165 of the trench.

In this manner, by forming the second thermal oxide film 22 substantially having a uniform film thickness extending from the point P on the trench sidewall 16b to over the substrate main surface 10a, the thermal oxide film at the trench top edge 167 can be suppressed from being reduced in thickness.

Figure 3B:
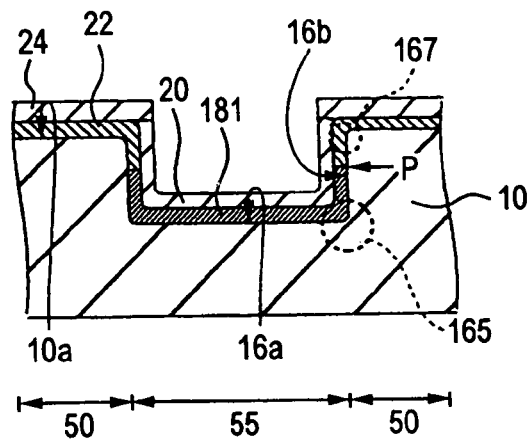

Subsequently, on the second thermal oxide film 22, a silicon nitride film 24 as a protection film is formed to a film thickness in a range of from 20 to 40 nm by using an LP-CVD process based on a dichlorosilane gas (as a main ingredient gas) (FIG. 3B). Herein, forming the second thermal oxide film 22 can be utilized also in forming the pad oxide film usually required in forming the silicon nitride film in the active region 50.

Figure 3C:
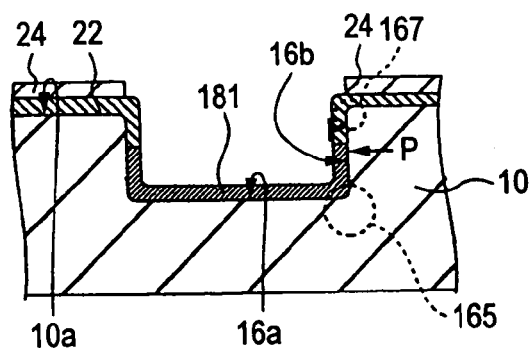

Subsequently, on the silicon nitride film 24, a mask is pattern-formed by photolithography etching to expose the surface of the silicon nitride film in the region 55 for forming device isolation (not shown). Thereafter, the exposed part of the silicon nitride film 24 is removed by wet etching using hot phosphoric acid (FIG. 3C).

Figure 3D:
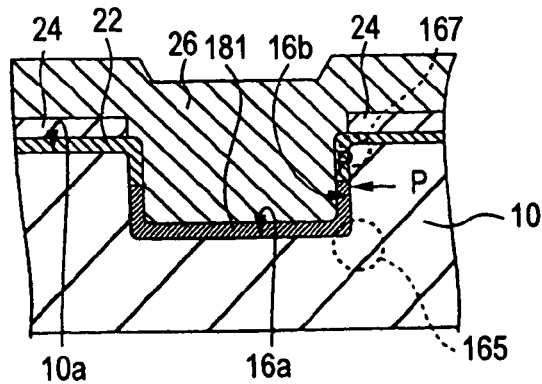

Subsequently, an insulation film 26 is deposited in a film thickness range of from 550 to 700 nm by an HDP-CVD (High Density Plasma-CVD) process, in a manner filling the trench 16 and covering the silicon nitride film 24 (FIG. 3D).

Figure 4A:
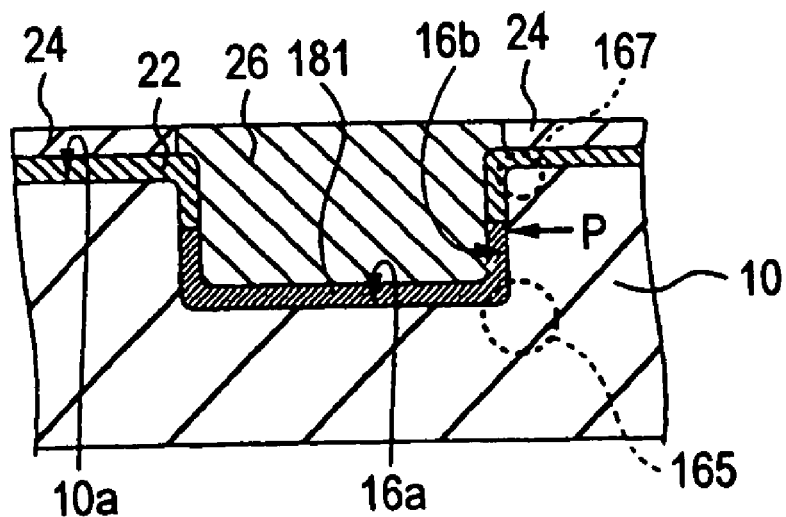
FIGS. 4A and 4B are schematic sectional views (4) for explaining a manufacturing process for a semiconductor device according to the invention.
Figure 4B:
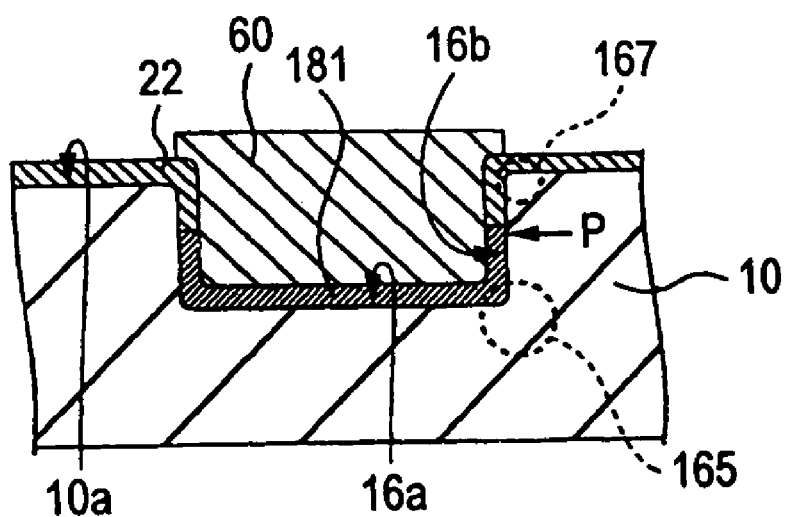

Subsequently, after the silicon oxide film (i.e., insulation film) 26 is polished by using a CMP process in a manner exposing the surface of the silicon nitride film 24 as a stopper film (FIG. 4A), the silicon nitride film 24 is removed by wet etching using hot phosphoric acid to thereby form an isolating part 60 (FIG. 4B). This isolating part 60 is formed by a part of the insulation film remaining within the trench.

As apparent from the above explanation, this embodiment can form a first thermal oxide film in a bottom edge of a trench by wet oxidation and a second thermal oxide film at a top edge of the trench by dry oxidation.

As a result, it is possible to overcome the facet occurring in the thermal oxide film at the trench bottom edge and the thickness reduction in the thermal oxide film at the trench top edge.

Namely, by individually forming a thermal oxide film at each edge under the thermal oxidation condition suited for the edge, it is possible to obtain a semiconductor device higher in reliability than the conventional, in which the electric-field concentration and junction leak current at the trench top edge are suppressed.

Incidentally, the present invention is not limited only to the above embodiment, and desirable and suitable combination of various conditions can be applied to the invention.

What is claimed is:

1. A method for manufacturing a semiconductor device comprising:
   a step of forming a groove for forming a device isolation part extending from a main surface of a semiconductor substrate to an intermediate depth of the semiconductor substrate;
   a step of forming by wet oxidation a first thermal oxide film extending from over a bottom surface of the groove to an intermediate point on a sidewall of the groove, the intermediate point being at a depth within a range of 100 nm to 200 nm from the main surface of the semiconductor substrate; and
   a step of forming by dry oxidation a second thermal oxide film extending from the intermediate point on the sidewall of the groove to over the main surface of the semiconductor substrate.

2. A method for manufacturing a semiconductor device according to claim 1, wherein the groove forming step comprises forming, by patterning, a mask exposing a region of the main surface corresponding to the groove to be formed in the main surface, and thereafter a first etching is carried out using the mask on the semiconductor substrate, thereby forming the groove on the main surface of the semiconductor substrate;
   the first thermal oxide film forming step including a step of forming by wet oxidation a pre-first thermal oxide film extending from over the bottom surface of the groove to over a region of the main surface of the semiconductor substrate outside the groove, a step of forming an etching-resisting film covering the pre-first thermal oxide film at a bottom surface part of the groove, and a step of carrying out a second etching on the pre-first thermal oxide film by using the etching-resisting film and selectively removing the pre-first thermal oxide film in a part extending from the main surface of the semiconductor substrate to the intermediate point, wherein a remaining part of the pre-first thermal oxide film is the first thermal oxide film; and
   the second thermal oxide film forming step including a step of forming the second thermal oxide film extending from the intermediate point on the sidewall of the groove to over a main surface part of the semiconductor substrate outside the groove, while the etching-resisting film remains as an antioxidation film.

3. A method for manufacturing a semiconductor device according to claim 2, wherein the etching-resisting film is formed extending from over the bottom surface of the groove to over a region of the main surface outside the groove and, prior to the second etching, the etching-resisting film is polished to expose a surface of the pre-first thermal oxide film on the main surface.

4. A method for manufacturing a semiconductor device according to claim 2, wherein the second etching is carried out by using an etching solution containing hydrogen fluoride acid.

5. A method for manufacturing a semiconductor device according to claim 1, further including a step of forming a protection film on the second thermal oxide film on the main surface of the semiconductor substrate outside the groove, a step of depositing an insulation film to fill the groove and cover the protection film, a step of polishing the insulation film to expose a surface of the protection film, and a step of removing the protection film wherein a remaining part of the insulation film in the groove is the device isolation part.

6. A method for manufacturing a semiconductor device, according to claim 1, wherein a heating temperature Tw (°

C.) of the semiconductor substrate during the wet oxidation is in a range of from 700 to 1000° C., a heating temperature Td (° C.) of the semiconductor substrate during the dry oxidation is in a range of from 800 to 1200° C., and the wet oxidation and the dry oxidation are carried out under a condition satisfying Tw(° C.) <Td (° C.).

7. A method of manufacturing a semiconductor device comprising:
    forming a groove in a surface of a semiconductor substrate;
    forming a first thermal oxide on a bottom of the groove and extending up to an intermediate point on a sidewall of the groove, by wet oxidation;
    forming a second thermal oxide on the surface of the semiconductor substrate and extending down to the intermediate point on the sidewall of the groove, by dry oxidation; and
    forming an insulating film to entirely bury the groove, after said forming a first thermal oxide and said forming a second thermal oxide.

8. The method of manufacturing a semiconductor device of claim 7, wherein the intermediate point is at a depth within a range of 100 nm to 200 nm from the surface of the semiconductor substrate.

9. The method of manufacturing a semiconductor device of claim 7, wherein said forming a first thermal oxide comprises:
    forming a preliminary thermal oxide layer covering the surface of the semiconductor substrate and within the groove, by wet oxidation;
    forming an etch resistant film on the preliminary thermal oxide layer within the groove; and
    etching the preliminary thermal oxide layer on the sidewall of the groove and covering the surface of the semiconductor substrate using the etch resistant film as a mask, whereby a remaining portion of the preliminary thermal oxide layer is the first thermal oxide.

10. The method of manufacturing a semiconductor device of claim 9, wherein said forming a etch resistant film comprises:
    forming an etch resistant material on an entirety of the preliminary thermal oxide layer; and
    removing the etch resistant material over the surface of the semiconductor substrate, whereby a remaining portion of the etch resistant material on the preliminary thermal oxide layer within the groove is the etch resistant film.

11. The method of manufacturing a semiconductor device of claim 10, wherein said removing the etch resistant film comprises chemical mechanical polishing.

12. The method of manufacturing a semiconductor device of claim 9, wherein the etch resistant film is a silicon nitride.

13. The method of manufacturing a semiconductor device of claim 7, wherein said forming an insulating film comprises:
    forming a protection film on the second thermal oxide over the surface of the semiconductor substrate and not within the groove,
    forming an insulating material on an entirety of the protection film and within the groove on the first and second thermal oxides to entirely bury the groove;
    removing a portion of the insulating material using the protection film as a stopper film; and
    removing the protection film, whereby a remaining portion of the insulating material is the insulating film.

14. The method of manufacturing a semiconductor device of claim 13, wherein said removing a portion of the insulating material comprises chemical mechanical polishing.

15. The method of manufacturing a semiconductor device of claim 13, wherein the protection film is a silicon nitride.

* * * * *